United States Patent
Toyoda

(10) Patent No.: US 7,217,334 B2
(45) Date of Patent: May 15, 2007

(54) METHOD FOR FORMING FILM, METHOD FOR FORMING WIRING PATTERN, METHOD FOR MANUFACTURING SEMICONDUCTOR DEVICE, ELECTRO-OPTICAL DEVICE, AND ELECTRONIC DEVICE

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 76 days.

(21) Appl. No.: 10/933,438

(22) Filed: Sep. 3, 2004

(65) Prior Publication Data

US 2005/0087289 A1     Apr. 28, 2005

(30) Foreign Application Priority Data

Sep. 4, 2003    (JP)    ............... 2003-312770

(51) Int. Cl.
- B44C 1/00    (2006.01)
- H01L 21/36    (2006.01)
- B32B 27/16    (2006.01)
- G01C 3/00    (2006.01)
- B29C 65/48    (2006.01)

(52) U.S. Cl. ............ 156/230; 156/247; 438/478; 438/689; 430/201

(58) Field of Classification Search ............ 156/230, 156/247; 430/11, 14, 17, 18, 5, 31, 256; 438/48, 104, 478, 689
See application file for complete search history.

(56) References Cited

U.S. PATENT DOCUMENTS

| | | | | |
|---|---|---|---|---|
| 2,297,691 A | * | 10/1942 | Carlson | 430/55 |
| 4,411,735 A | * | 10/1983 | Belani | 438/701 |
| 4,804,600 A | * | 2/1989 | Kato et al. | 430/5 |
| 4,942,110 A | * | 7/1990 | Genovese et al. | 430/198 |
| 5,147,397 A | * | 9/1992 | Christ et al. | 623/6.46 |
| 5,171,650 A | * | 12/1992 | Ellis et al. | 430/20 |
| 5,685,939 A | * | 11/1997 | Wolk et al. | 156/234 |
| 5,997,677 A | * | 12/1999 | Zaher | 156/230 |
| 6,274,508 B1 | * | 8/2001 | Jacobsen et al. | 438/758 |
| 6,291,126 B2 | * | 9/2001 | Wolk et al. | 430/200 |
| 2002/0037481 A1 | * | 3/2002 | Lee et al. | 430/396 |
| 2003/0146019 A1 | * | 8/2003 | Hirai | 174/257 |

FOREIGN PATENT DOCUMENTS

| | | | |
|---|---|---|---|
| JP | 10208881 A | * | 8/1998 |
| JP | A 10-208881 | | 8/1998 |
| JP | 2001-168061 | | 6/2001 |
| JP | 2001168061 A | * | 6/2001 |
| JP | A 2001-249342 | | 9/2001 |
| WO | 9505623 A1 | * | 2/1995 |
| WO | WO 9505623 A1 | * | 2/1995 |

\* cited by examiner

*Primary Examiner*—Chris Fiorilla
*Assistant Examiner*—Sonya Mazumdar
(74) *Attorney, Agent, or Firm*—Oliff & Berridge, PLC

(57) ABSTRACT

Exemplary embodiments of the invention to provide an efficient and productive method to form a reliable film. A method to form a film according to exemplary embodiments of the present invention, in which a transferring layer formed on a substrate is transferred to a workpiece to form a predetermined film on the workpiece, includes treating a surface of the workpiece to enhance or improve the adhesion between the transferring layer and the workpiece by chemical interaction.

48 Claims, 10 Drawing Sheets

METHOD FOR FORMING FILM, METHOD FOR FORMING WIRING PATTERN, METHOD FOR MANUFACTURING SEMICONDUCTOR DEVICE, ELECTRO-OPTICAL DEVICE, AND ELECTRONIC DEVICE

BACKGROUND OF THE INVENTION

1. Field of Invention

Exemplary embodiments of the present invention relate to a method to form a predetermined film on a workpiece, a method to form a wiring pattern using the method to form a film, a method to manufacture a semiconductor device, and to an electro-optical device and an electronic device that have the wiring pattern and/or the semiconductor device.

2. Description of Related Art

The industrial application of a transferring technique utilizing a laser is disclosed in the related art. For example, techniques called laser thermal transfer and laser-induced thermal imaging (LITI) have been adopted. For example, related art Documents Japanese Unexamined Patent Application Publication No. 10-208881 and Japanese Unexamined Patent Application Publication No. 2001-249342 disclose techniques in which transferring layers formed on substrates are transferred to workpieces by laser irradiation.

SUMMARY OF THE INVENTION

In such transferring techniques, three bonding strengths that act on a transferring layer, that is, 1) tack strength of a transferring layer, 2) adhesive strength between a transferring layer and a substrate, and 3) adhesive strength between a transferring layer and a workpiece, should all be optimized; otherwise transferring patterns may have some defect. For example, increased tack strength of a transferring layer may generate an incompletely transferred portion in an area exposed to a scanning laser. Decreased adhesive strength between a substrate and a transferring layer may cause the entire transferring layer to be transferred to the workpiece without patterning. Decreased adhesive strength between a transferring layer and a workpiece may result in poor-quality transferring and at the worst in a defective condition in which no transferring occurs.

In light of such circumstances, exemplary embodiments of the present invention address or overcome such defective conditions described above and provide an efficient and productive method to form a reliable film. Exemplary embodiments of the present invention provide a method to form a wiring pattern that utilizes the method to form a film, a method to manufacture a semiconductor device that utilizes the method to form a film, and an electro-optical device and an electronic device that have the wiring pattern or the semiconductor device.

To address or resolve the above discussed and/or other problems, a method to form a film according to exemplary embodiments of the present invention, in which a transferring layer formed on a substrate is transferred to a workpiece to form a predetermined film on the workpiece, includes treating a surface of the workpiece to enhance or improve the adhesion between the transferring layer and the workpiece by chemical interaction. According to exemplary embodiments of the present invention, the transferring layer is transferred to the workpiece to form a film including the transferring layer. In particular, the surface treatment of the workpiece to enhance or improve the adhesion between the workpiece and the transferring layer by chemical interaction allows for high-quality transferring, preventing or inhibiting defective conditions, such as detachment of the transferred film from the surface of the workpiece.

The chemical interaction to enhance or improve the adhesion between the workpiece and the transferring layer according to exemplary embodiments of the present invention is based on at least any of a hydrogen bond, electrostatic interaction, acid-base interaction, hydrophobic interaction, intermolecular force, a covalent bond, an ionic bond, and a metal-thiol bond. The chemical interaction can be produced just by forming an organic thin-film having a functional group on the workpiece. Thus, the surface treatment can easily be performed.

As a specific example of the surface treatment, a monomolecular film or a polymer film may be applied to the workpiece. In the formation of the monomolecular film, a functional group that has a high affinity for the workpiece can be arranged on the surface facing the workpiece, and a functional group that has a high affinity for the transferring layer can be arranged on the opposite surface of the monomolecular film (the outermost surface of the workpiece including the monomolecular film). Likewise, for the polymer film, the same arrangements on both the workpiece side and the opposite side can be provided by, for example, microphase separation of a copolymer, microphase separation between a main chain and side chains, and microphase separation between one side chain and another side chain. Specifically, when a polymer film contains a side chain that has a high-affinity functional group for the workpiece and a side chain that has a high-affinity functional group for the transferring layer, each side chain forms a microdomain on the workpiece side or the opposite side (the outermost surface of the workpiece including the monomolecular film).

The organic thin-film may contain at least one of a carboxyl group; an amino group; a hydroxyl group; an isocyanate group; a silicon group having an alkoxy group, halogen, an alkyl group, or an amino group; or a thiol group. Such a functional group has a high affinity for a substrate, such as an oxide-based glass or metal, thus enabling a surface treatment that imparts peeling resistance to the substrate. In addition, before the formation of the organic thin-film, a step of making the surface of the workpiece lyophilic or a step of oxidizing the surface of the workpiece will increase the affinity for, for example, a dip-coating solution for the preparation of the organic thin-film. Thus, the organic thin-film can be produced uniformly. The step of making the surface of the workpiece lyophilic may be addressed or achieved by, for example, ultraviolet treatment, oxygen plasma treatment, acid treatment, or alkali treatment.

In the method to form a film according to exemplary embodiments of the present invention, the transferring layer may be made of an organic material, and the surface of the workpiece may be treated to have enhanced or improved adhesion by chemical interaction with the organic material. In this case, a film of the organic material is formed on the workpiece, and the resulting film has excellent adhesion to the workpiece.

As described above, when the transferring layer is made of an organic material, the surface of the workpiece is preferably treated by disposing a reactive group, such as an epoxy group or an isocyanate group; a polar group, such as a thiol group, a hydroxyl group, a carboxyl group, or an amino group; or an ionic group, such as an ammonium group or a pyridinium group, on the outermost surface of the workpiece including the surface treatment film. In this case, the reactive group and the organic material of the transferring layer (for example, a functional group on the organic material) may react to form a strong bond, or the polar group and the organic material (for example, a functional group on the organic material) may cause a chemical interaction, such as a hydrogen bond, and thereby the adhesion between the transferring layer and the workpiece can be further increased.

On the other hand, in the method to form a film according to exemplary embodiments of the present invention, the transferring layer may be made of a metallic material, and the surface of the workpiece may be treated to have enhanced or improved adhesion by chemical interaction with the metallic material. In this case, a film made of the metallic material is formed on the workpiece, and the resulting film has excellent adhesiveness to the workpiece.

As described above, when the transferring layer is made of a metallic material, the surface of the workpiece is preferably treated by disposing a metal-coordinating group, such as a carboxyl group or an amino group on the outermost surface of the workpiece including the surface treatment film. In this case, a metal in the transferring layer coordinates to the metal-coordinating group, and thereby the adhesion between the transferring layer and the workpiece can be further increased.

The method to form a film according to exemplary embodiments of the present invention may include introducing a light-heat converting material, which converts light energy into thermal energy, into the substrate, forming the transferring layer on the substrate, and irradiating a predetermined area on the substrate while the transferring layer and the workpiece face each other to transfer the transferring layer selectively to the irradiated area on the workpiece. In this case, the light-heat converting material in the substrate can efficiently convert the light energy of the emitted light into thermal energy. Then, the thermal energy thus supplied to the transferring layer, allows a part of the transferring layer (corresponding to the irradiated area) to be transferred in sublimed form or molten state on the workpiece. Thus, by irradiating a predetermined area of the substrate with light in a film pattern of interest, the transferring layer corresponding to the predetermined area is transferred to the workpiece, and thereby the desired film pattern of the transferring layer is formed on the workpiece. Consequently, exemplary embodiments of the present invention can provide the desired film pattern on the workpiece simply by the irradiation of light, and does not require development or the like, thus enhancing or improving the productivity.

In the method to form a film according to exemplary embodiments of the present invention, the substrate, the transferring layer, and a light-heat converting layer containing the light-heat converting material may be provided independently, or the substrate may contain the light-heat converting material. The transferring layer may also contain the light-heat converting material. In any case, the light-heat converting material efficiently converts the light energy of the emitted light into thermal energy, which is supplied to the transferring layer. Thus, the transferring is efficiently performed.

When the substrate, the transferring layer, and the light-heat converting layer containing the light-heat converting material are provided independently, the light-heat converting layer may be disposed on a surface of the substrate facing the transferring layer or on the other surface of the substrate, which does not face the transferring layer. In both cases, the light energy of the emitted light can be converted into thermal energy, which is supplied to the transferring layer. In particular, the light-heat converting layer between the substrate and the transferring layer efficiently supplies the thermal energy generated by the light-heat converting layer to the transferring layer adjacent to the light-heat converting layer.

The method to form a film according to exemplary embodiments of the present invention may include forming a gas-generating layer between the substrate and the transferring layer, the gas-generating layer containing a gas-generating material, which generates a gas by light irradiation or heating. Alternatively, the method to form a film according to exemplary embodiments of the present invention may include introducing the gas-generating material, which generates a gas by light irradiation or heating, into the substrate. Such a step utilizes the energy of the gas generated from the gas-generating material to separate the transferring layer from the substrate, transferring the transferring layer smoothly to the workpiece.

In the method to form a film according to exemplary embodiments of the present invention, the light may be a laser beam that has a wavelength depending on the light-heat converting material. Thus, the light energy supplied to the light-heat converting material can be efficiently converted into thermal energy.

In the method to form a film according to exemplary embodiments of the present invention, the light irradiation to the substrate may be performed through a mask having a predetermined pattern. This provides a film pattern having a smaller diameter than the emitted beam. Alternatively, the light irradiation may be performed while moving the substrate and the workpiece relative to the light. In other words, the irradiation light (laser beam) is moved relative to the substrate and the workpiece to pattern the film. This eliminates a step of manufacturing the mask.

In the method to form a film according to exemplary embodiments of the present invention, the substrate may be exposed to the light while the transferring layer on the substrate is in close contact with the workpiece. This allows the transferring layer to be transferred smoothly from the substrate to the workpiece. In this case, the transferring layer on the substrate is first placed opposite the workpiece. Then, the space between the transferring layer and the workpiece is depressurized, and the transferring layer and the workpiece are brought into close contact with each other. After transferring, the substrate and the workpiece can be separated by relieving the vacuum.

A method to form a wiring pattern according to exemplary embodiments of the present invention utilizes a film pattern obtained by the method to form a film, serving as a wiring. In other words, the transferring layer (film pattern) formed on the workpiece by the method to form a film can be used for providing a wiring pattern. Furthermore, it is possible to use the transferring layer (film pattern) formed on the workpiece according to the method to form a film to build a bank, and then place a droplet containing a material to form the wiring pattern between the banks to form the wiring pattern on the workpiece. In this case, a fine wiring pattern can be addressed or achieved according to a droplet-discharging method, which saves the consumption of the material.

In a method to manufacture a semiconductor device according to exemplary embodiments of the present invention, a semiconductor element is manufactured by using the wiring pattern formed by the method to form a film. The method to manufacture a semiconductor device according to exemplary embodiments of the present invention provides the wiring pattern on the workpiece without development or the like, thus allowing for efficient manufacturing of the semiconductor device that includes semiconductor elements. The semiconductor device has a peeling-resistant wiring pattern and is highly reliable.

An electro-optical device of exemplary embodiments of the present invention has the wiring pattern formed by the method to form a wiring pattern. Furthermore, the electro-optical device of exemplary embodiments of the present invention has the semiconductor device that is manufactured by the method to manufacture a semiconductor device. In addition, an electronic device of exemplary embodiments of the present invention has the electro-optical device. Exemplary embodiments of the present invention provide an electro-optical device that is efficiently manufactured and is highly reliable, and the electronic device that includes the electro-optical device. Exemplary examples of the electro-optical device include liquid crystal displays, organic electroluminescent (EL) displays, and plasma displays.

DETAILED DESCRIPTION OF PREFERRED EMBODIMENTS

Method to Form a Film

The method to form a film according to exemplary embodiments of the present invention will now be further illustrated with reference to the attached drawings.

Figure 1:
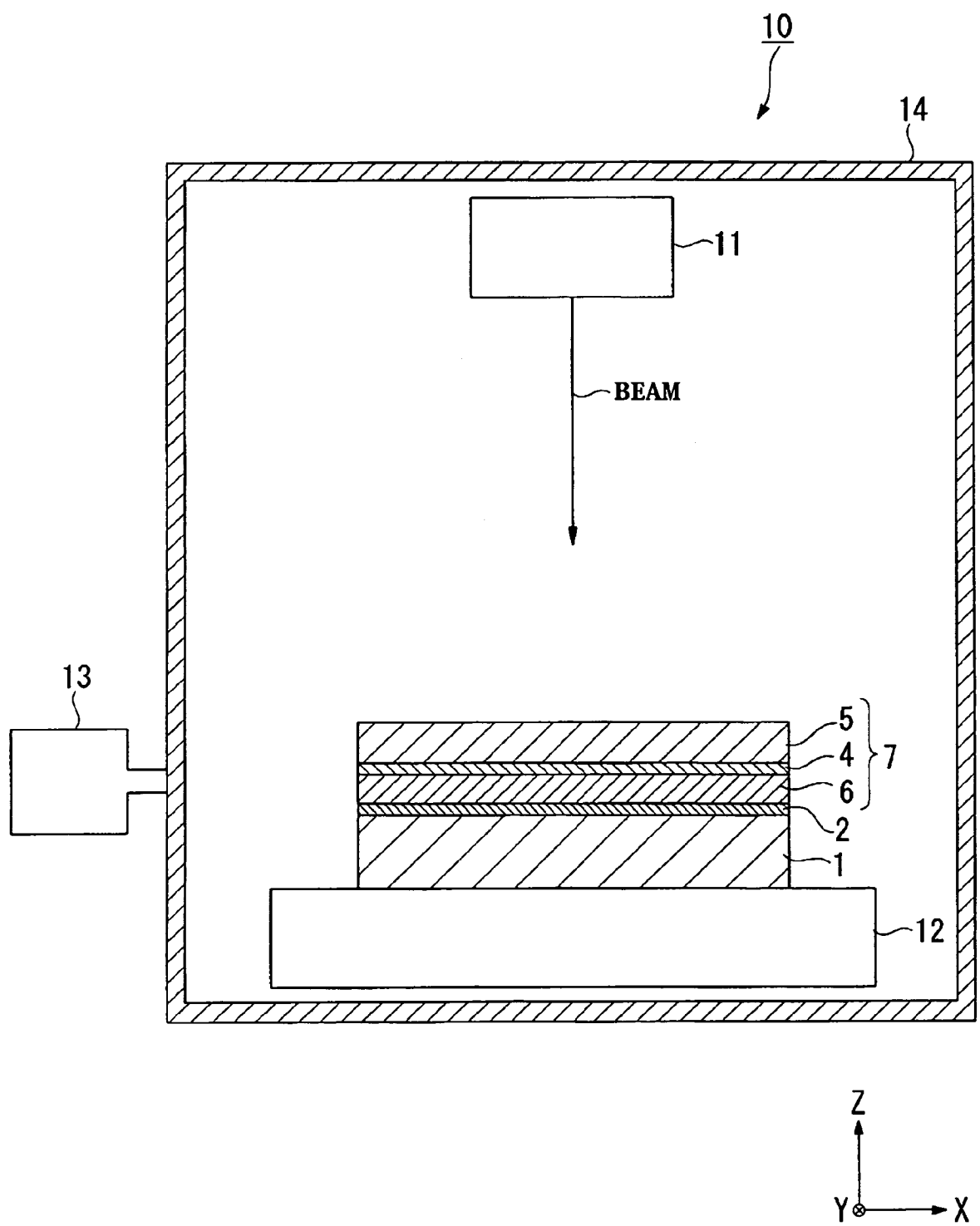
FIG. 1 is a schematic showing one exemplary embodiment of a film-forming apparatus for use in a method to form a film according to the present invention.

FIG. 1 is a schematic showing one example of a film-forming apparatus for use in the method to form a film according to exemplary embodiments of the present invention. In FIG. 1, the film-forming apparatus 10 includes a laser beam source 11, which emits a laser beam having a predetermined wavelength and a stage 12, which supports a workpiece 1. The workpiece 1 is treated to have a so-called monomolecular film (surface treatment film) 2 on the surface. The laser beam source 11 and the stage 12, which supports the workpiece 1, are disposed in a chamber 14. The chamber 14 is coupled to an aspirator 13, which can remove gas in the chamber 14. In the present exemplary embodiment, a near-infrared semiconductor laser (wavelength 830 nm) is used as the laser beam source 11.

In the following description, it is assumed that a certain direction in the horizontal plane is an X-axis direction, a direction orthogonal to the X-axis direction in the horizontal plane is a Y-axis direction, and a direction orthogonal to the X-axis and the Y-axis (vertical direction) is a Z-axis direction.

A donor sheet 7 is in close contact with the monomolecular film 2 on the workpiece 1. The donor sheet 7 includes a substrate 5, a light-heat converting layer 4 on the substrate 5, and a transferring layer 6. The substrate 5, the transferring layer 6, and the light-heat converting layer 4 are provided independently. The transferring layer 6 is disposed below the undersurface (workpiece side) of the substrate 5. The light-heat converting layer 4 is also disposed below the undersurface of the substrate 5, that is, in the direction of the transferring layer 6. The light-heat converting layer 4 is disposed between the substrate 5 and the transferring layer 6, so that the light-heat converting layer 4 and the transferring layer 6 adjoin each other. The transferring layer 6 in the donor sheet 7 faces the monomolecular film 2 on the workpiece 1. The transferring layer 6 and the monomolecular film 2 are in close contact.

The stage 12 is movable in the X-axis direction and the Y-axis direction while supporting the workpiece 1, the monomolecular film 2, and the donor sheet 7 in close contact with the monomolecular film 2. Thus, the workpiece 1 and donor sheet 7 are movable with the stage 12 relative to the beam from the light source 11. The stage 12 is also movable in the Z-axis direction. An optical system (not shown) is disposed between the light source 11 and the donor sheet 7 supported by the stage 12. The position of the donor sheet 7 (workpiece 1) relative to the focus of the optical system is adjustable by the movement of the stage 12, which supports the workpiece 1 and the donor sheet 7, in the Z-axis direction. The donor sheet 7 (substrate 5) supported by the stage 12 is irradiated with the beam from the light source 11.

The substrate 5 is, for example, a glass substrate or a transparent polymer that the laser beam can pass through. Examples of the transparent polymer include polyester, such as polyethylene terephthalate, polyacrylics, polyepoxy, polyethylene, polystyrene, polycarbonate, polysulfone, and polyimide. Preferably, the substrate 5 of the transparent polymer has a thickness of 10 to 500 μm; Thus, the substrate 5 may have a long and narrow shape and be rolled, and thus can be held on a rotating drum and be conveyed (moved), for example.

While the substrate 5 is supported by the stage 12, which moves in the X and Y direction in this exemplary embodiment, it may be held on the rotating drum that is movable in a horizontal direction (scanning direction, X-axis direction), a rotational direction (Y-axis direction), and a vertical direction (Z-axis direction).

The light-heat converting layer 4 contains a light-heat converting material that converts light energy into thermal energy. The light-heat converting material in the light-heat converting layer 4 may be any known material that can efficiently convert light into heat, and includes, but not limited to, a metal layer containing aluminum, its oxides and/or sulfides, or an organic layer that is composed of a polymer containing carbon black, graphite, or an infrared-absorbing dye. Examples of the infrared-absorbing dye include anthraquinones, dithiol-nickel complexes, cyanines, azo-cobalt complexes, dimmoniums, squaleliums, phthalocyanines, and naphthalocyanines. The light-heat converting material that is dissolved or is dispersed in a binder resin, for example, in a synthetic resin, such as epoxy resin may be applied to the substrate 5. The epoxy resin works as a hardener and cures to fix the light-heat converting layer 4 on the substrate 5. Of course, the light-heat converting material may be applied to the substrate 5 without being dissolved or being dispersed in the binder.

When the metal layer is used as the light-heat converting layer 4, it can be applied to the substrate 5 by vacuum evaporation, electron beam evaporation, or sputtering. When the organic layer is used as the light-heat converting layer 4, it can be applied to the substrate 5 by a common film-coating method, such as extrusion coating, spin coating, gravure coating, reverse roll coating, rod coating, micro gravure coating, or knife coating. In the exemplary method for coating the light-heat converting layer 4, it is preferred to eliminate static electricity on the substrate 5 and thus uniformly apply functional fluid to prepare the light-heat converting layer to the substrate 5. Hence, an apparatus used in each method is preferably equipped with a static eliminator.

The transferring layer 6 in the present exemplary embodiment contains an electrically conductive metallic material. The metallic material is an electrically conductive material, such as aluminum or silver. This provides a predetermined wiring pattern on the workpiece 1 after transferring.

Figure 7:
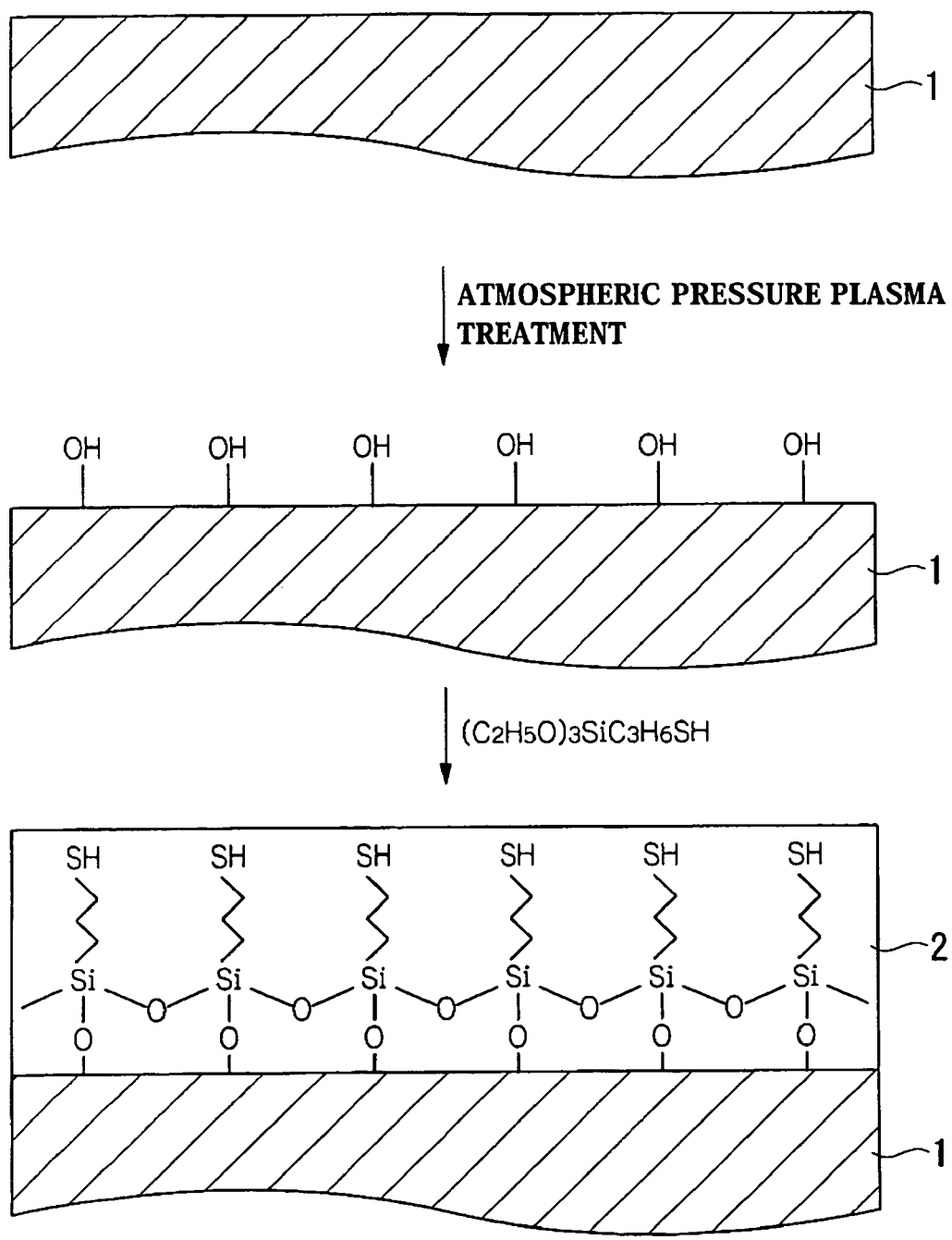
FIG. 7 is a schematic showing one example of a surface treatment step of the method to form a film according to exemplary embodiments of the present invention.

The workpiece 1 in the present exemplary embodiment is composed of polyethylene terephthalate. The monomolecular film 2 in the present exemplary embodiment is composed of 3-mercaptopropyltriethoxysilane. For example, in a specific method for forming the monomolecular film 2, the workpiece 1 is treated with atmospheric pressure plasma at 1 mm/s, as shown in FIG. 7. The workpiece 1 and a vessel containing 3-mercaptopropyltriethoxysilane are placed in a Teflon® container. Then, the container is vacuumed, is heated to 80° C., and is held at that temperature for 4 hours to form the monomolecular film 2 on the workpiece 1.

Figure 2A:
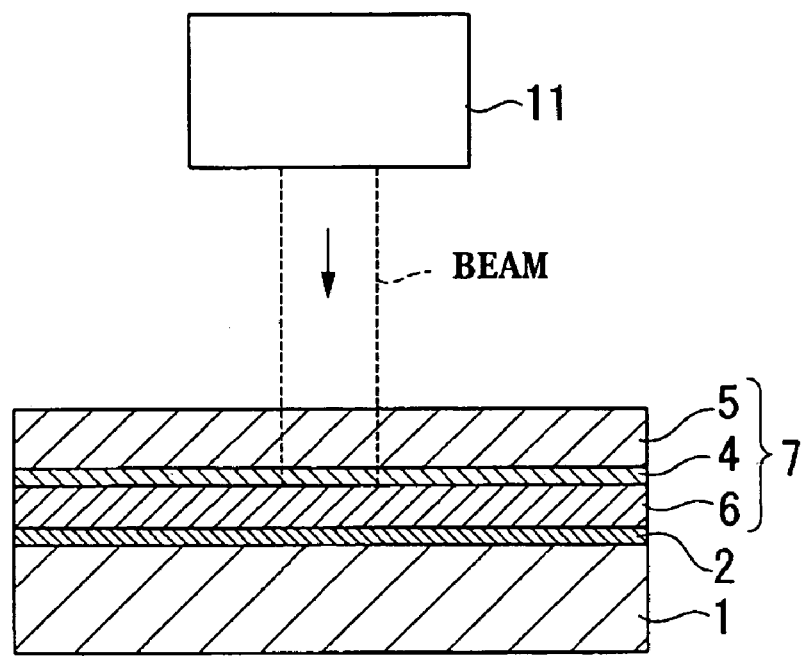
FIGS. 2(a)–(b) are schematics showing one example of a transferring step of the method to form a film according to exemplary embodiments of the present invention.

Referring to FIG. 2, a procedure for patterning a film will be described below. As shown in FIG. 2(a), the transferring layer 6 in the donor sheet 7 and the monomolecular film 2 on the workpiece 1 are disposed opposite to each other and are brought into close contact. The close contact between the transferring layer 6 and the monomolecular film 2 is addressed or achieved by disposing the transferring layer 6 and the monomolecular film 2 face-to-face, and then by activating the aspirator 13 (see FIG. 1) to remove the gas in the chamber 14, reducing the pressure of the chamber 14. Accordingly, the space between the transferring layer 6 and the monomolecular film 2 is also put into negative pressure, and thus the transferring layer 6 and the monomolecular film 2 is brought into close contact.

The donor sheet 7 (substrate 5) is irradiated from above with a laser beam having a predetermined beam diameter. The irradiation of the laser beam increases the temperature of the irradiated area in the substrate 5 and the light-heat converting layer 4. The light-heat converting layer 4 converts the light energy of the emitted beam into thermal energy, and supplies the thermal energy to the adjacent transferring layer 6. A part of the transferring layer 6 that is supplied with the thermal energy is heated above, for example, the glass transition temperature, into molten state, and is transferred to the monomolecular film 2 on the workpiece 1. The transferable portion of the transferring layer 6 corresponds to the area that is irradiated with the laser beam. Thus, the transferring layer 6 corresponding the area irradiated with the laser beam is transferred to the workpiece 1.

Figure 2B:
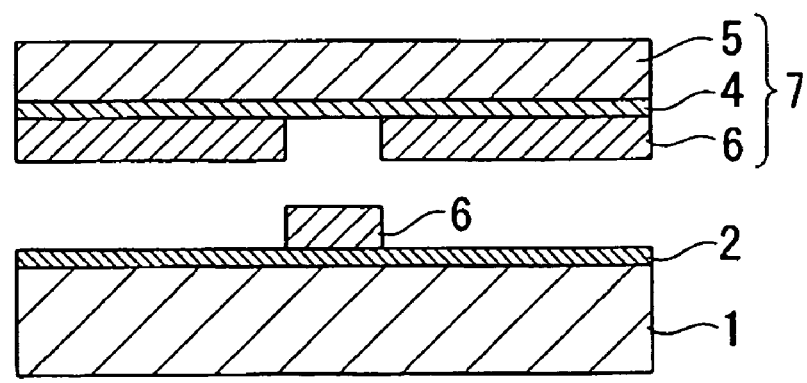

When the stage 12 moves in the XY plane relative to the emitted laser beam, a part of the transferring layer 6 is transferred to the workpiece 1 in response to the movement of the stage 12. In this manner, a film pattern (electrically conductive film pattern) is formed on the monomolecular film 2 on the workpiece 1. After the transferring layer 6 is transferred to the workpiece 1, the aspirator 13 is stopped to relieve the reduced pressure (negative pressure), and thereby the donor sheet 7 and the workpiece 1 can be separated, as shown in FIG. 2(b).

Thus, the light-heat converting layer 4 on the substrate 5 in the present exemplary embodiment effects the efficient conversion of the light energy of the emitted light into thermal energy. In addition, the thermal energy is supplied to the transferring layer 6, so that the portion of the transferring layer 6 corresponding to the irradiated area can be transferred to the workpiece 1. Thus, the transferring layer 6 corresponding to the irradiated area can be transferred to the workpiece 1 to form a desired film pattern on the workpiece 1 by irradiating a predetermined area on the substrate 5 that corresponds to the film pattern. Furthermore, the light-heat converting layer 4 can supply the transferring layer 6 with sufficient thermal energy to transfer the transferring layer 6 even with a near-infrared laser beam, without using an electron beam or ultraviolet rays. This gives a wider choice of the light irradiation apparatus; without using an expensive, large-scale light irradiation apparatus, the thermal energy can be sufficient to transfer the transferring layer 6 from the donor sheet 7 satisfactorily to form the film pattern.

In the present exemplary embodiment, a metallic material-based transferring layer 6 is transferred to the workpiece 1, which is coated with the monomolecular film 2 having a thiol group on the top. Thus, a chemical interaction between the metal of the transferring layer 6 and the mercapto group on the monomolecular film 2 serves to achieve good adhesion between the transferring layer 6 and the workpiece 1 in transferring. The chemical interaction with the metal of the transferring layer 6 is based on a metal-thiol bond. Such interaction can be addressed or achieved by placing an amino group instead of the thiol group on the monomolecular film 2 and attaching the amino group to the metal. While the monomolecular film 2 is applied to the workpiece 1 as surface treatment in the present exemplary embodiment, a polymer film having a functional group that can interact with the transferring layer 6 can be applied to the workpiece 1 to enhance or improve the adhesion between the transferring layer 6 and the workpiece 1.

In the present exemplary embodiment, a predetermined film pattern on the workpiece 1 is formed by moving the stage 12, which supports the workpiece 1 and the donor sheet 7. However, it is obvious that the beam may be moved while the workpiece 1 and the donor sheet 7 are fixed, or both the workpiece 1 and the donor sheet 7 and the beam may be moved. In addition, while the workpiece 1 and the donor sheet 7 may be moved by shifting the stage 12 in the XY plane, they may also be moved with the rotating drum, as described above.

Figure 3:
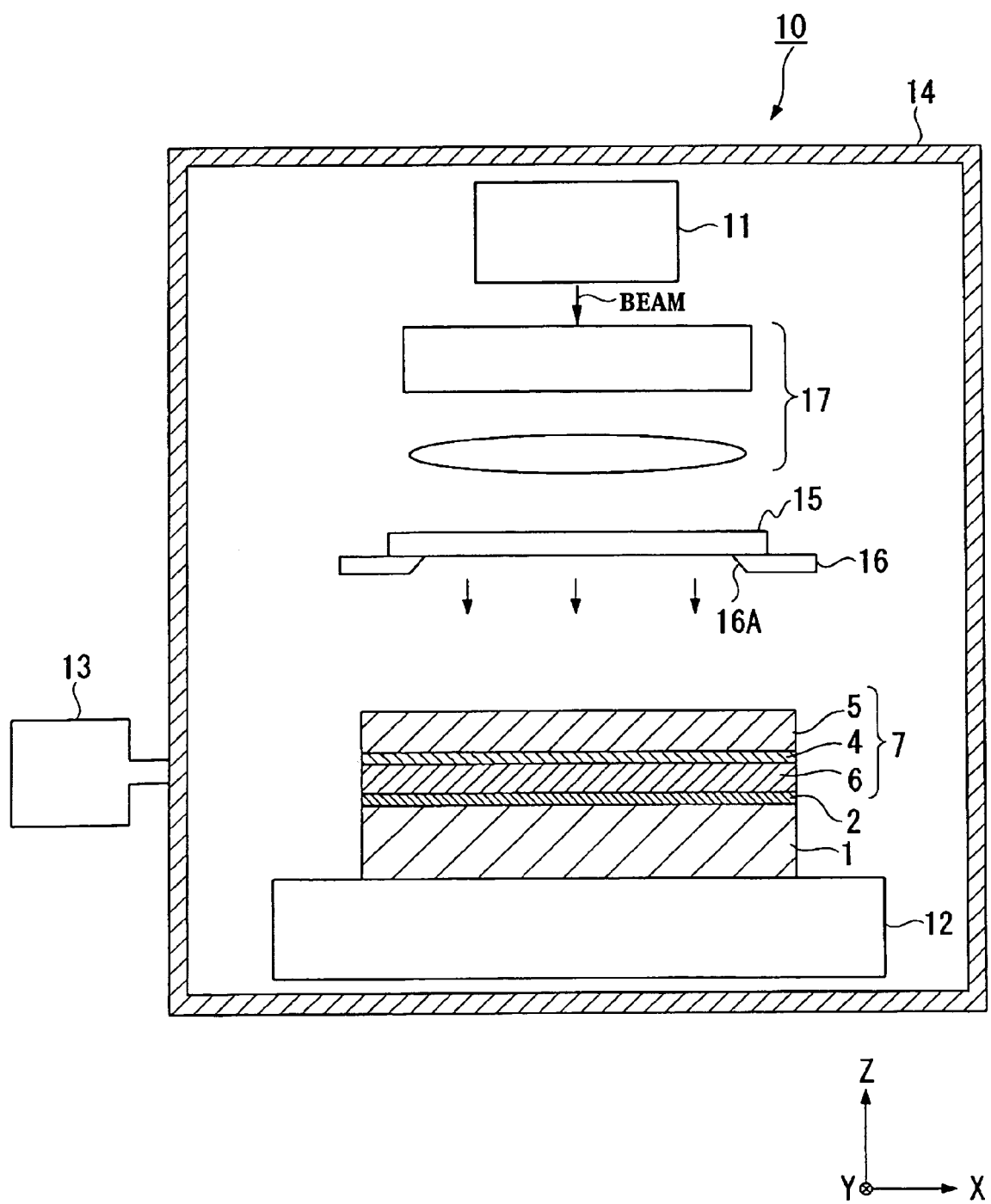
FIG. 3 is a schematic showing another exemplary embodiment of the film-forming apparatus for use in a method to form a film according to the present invention.

As shown in FIG. 3, the film pattern may also be formed by irradiating the donor sheet 7 with light passing through a mask 15, which has a pattern corresponding to the target film pattern. In an example shown in FIG. 3, the mask 15 is supported by a mask supported 16, which has an opening 16A to transmit the light passing through the mask 15. A beam from the light source 11 is converted into an illuminating light having a uniform illumination distribution by an optical system 17. The illuminating light illuminates the mask 15. The donor sheet 7 supported by the stage 12 is irradiated with the light passing through the mask 15. The irradiation generates heat, which causes a part of the transferring layer 6 to be transferred to the workpiece 1, thus forming the film pattern. The use of the mask 15 provides a film pattern having a smaller diameter than the beam from the laser beam source 11. On the other hand, as described above with reference to FIG. 1, the irradiation during the relative displacement of the beam and the donor sheet 7 (workpiece 1) can eliminate the need for manufacturing the mask 15.

While the mask 15 and the donor sheet 7 are separated during the irradiation of the donor sheet 7 in the example shown in FIG. 3, the donor sheet 7 may be irradiated with the light passing through the mask 15 with the mask 15 and the donor sheet 7 being in close contact with each other.

In addition to a near-infrared semiconductor laser, a mercury lamp, a halogen lamp, a xenon lamp, and a flash lamp may be used as the light source 11. Furthermore, any common laser, such as an ultraviolet laser, other than a near-infrared laser may be used.

Figure 4:
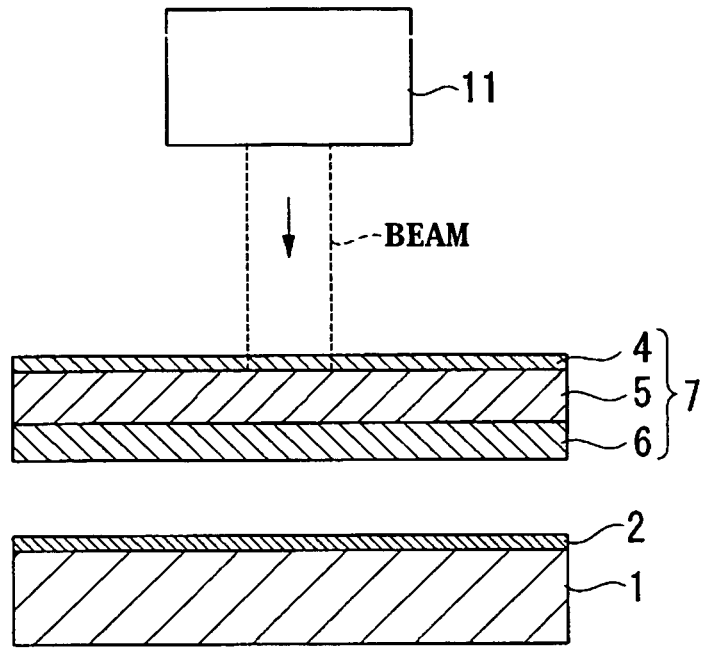
FIG. 4 is a schematic showing another example of the transferring step of the method to form a film according to exemplary embodiments of the present invention.

As shown in FIG. 4, the light-heat converting layer 4 may be disposed on the top surface of the substrate 5 opposite to the transferring layer 6. In this case, the thickness and the material of the substrate 5 are optimized so that the thermal energy generated by the light-heat converting layer 4 is satisfactorily conducted to the transferring layer 6 on the undersurface of the substrate 5. The light-heat converting layer 4 may be disposed on both the top surface and the undersurface of the substrate 5.

In the presence of the light-heat converting layer 4, the wavelength of the light is preferably determined by the light-heat converting material. That is, since the absorption band varies with a light-heat converting material used, light having a wavelength suitable for the light-heat converting material is used to convert the light energy into thermal energy efficiently. In other words, the light-heat converting material is selected for the emitted light. In the present exemplary embodiment, since a near-infrared semiconductor laser (wavelength 830 nm) is used as the laser beam source, a material that absorbs the light in an infrared to visible light range is preferably used as the light-heat converting material.

In the exemplary embodiments described above, the light-heat converting material is contained in a layer (light-heat converting layer 4) that is independent of the substrate 5 and the transferring layer 6. However, the light-heat converting material may be introduced into the substrate 5 or the transferring layer 6. Even in such a structure, the light energy of the laser beam can be converted into thermal energy, and the thermal energy can be supplied to the transferring layer 6. Furthermore, in addition to the substrate 5 containing the light-heat converting material, the light-heat converting layer 4 may also be provided.

Figure 5:
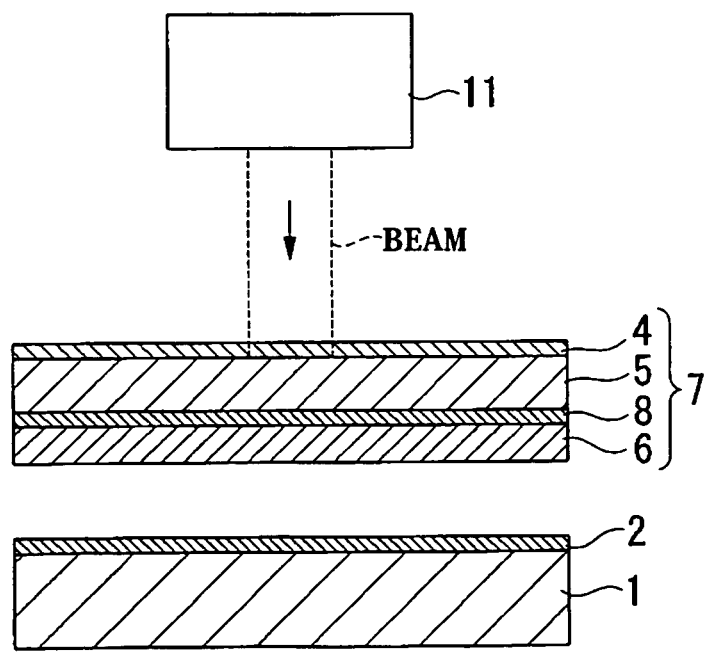
FIG. 5 is a schematic showing another example of the transferring step of the method to form a film according to exemplary embodiments of the present invention.

As shown in FIG. 5, a gas-generating layer 8 containing a gas-generating material, which generates gas by light irradiation or heating, may be provided between the substrate 5 and the transferring layer 6. The gas-generating material decomposes and releases a nitrogen gas or a hydrogen gas when absorbing light or thermal energy that is converted from the light energy, thus supplying energy to separate the transferring layer 6 from the substrate 5. Examples of the gas-generating material include at least one substance selected from the group consisting of pentaerythritol tetranitrate (PETN) and trinitrotoluene (TNT).

Figure 6:
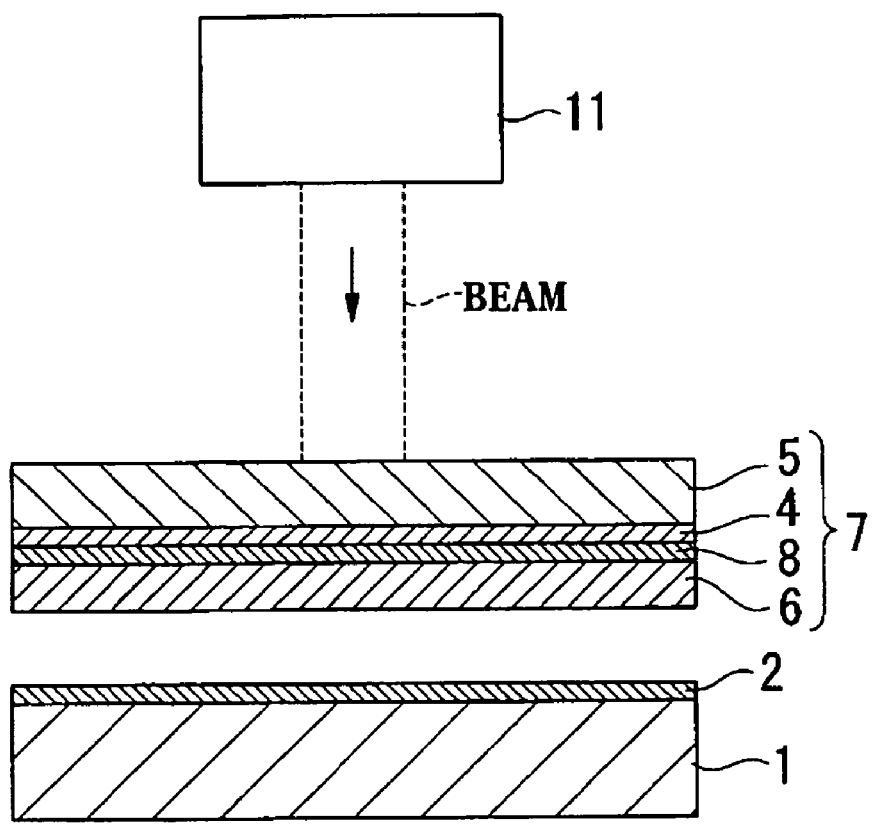
FIG. 6 is a schematic showing another example of the transferring step of the method to form a film according to exemplary embodiments of the present invention.

As shown in FIG. 6, when the light-heat converting layer 4 is disposed on the undersurface of the substrate 5, the gas-generating layer 8 may be provided between the light-heat converting layer 4 and the transferring layer 6. Alternatively, the gas-generating layer 8 may be provided between the substrate 5 and the light-heat converting layer 4. The light-heat converting layer 4 may contain the gas-generating material. The substrate 5 may contain the gas-generating material.

In the exemplary embodiment, as shown in FIG. 2, an intermediate layer for a uniform light-heat conversion of the light-heat converting layer 4 may be provided between the light-heat converting layer 4 and the transferring layer 6. A material that constitutes the intermediate layer is, for example, a resin material that satisfies the conditions described above. Such an intermediate layer may be prepared by applying a resin composition that has a predetermined composition to the light-heat converting layer 4 by a known coating method, such as spin coating, gravure coating, or die coating, and drying it. When the laser beam is emitted, the light energy is converted into thermal energy by the light-heat converting layer 4, and the thermal energy becomes uniform through the intermediate layer. Thus, the part of the transferring layer 6 that corresponds to the irradiation area is supplied with uniform thermal energy.

In the exemplary embodiment, as shown in FIG. 2, a thermoconductive layer or a release layer may be provided between the light-heat converting layer 4 and the transferring layer 6. A material that constitutes the thermoconductive layer or the release layer is, for example, poly α-methylstyrene. The thickness of the thermoconductive layer or the release layer is, but not limited to, approximately 1 μm.

The light-heat converting layer 4 may contain a release agent to enhance or improve the releasability between the light-heat converting layer 4 and the transferring layer 6. Examples of the release agent are related art release agents, including solid or waxy substances, such as polyethylene wax, amide wax, fine powder of silicone resin, and fine powder of fluorocarbon resin; surface active agents, such as fluorochemical and phosphoric ester; and oils, such as paraffin, silicone, and fluorocarbon oil. In particular, silicone oil is preferred. Examples of the silicone oil include, in addition to unmodified silicone oils, modified silicone oils, such as carboxylated, aminated, epoxidized, polyether-modified, and alkylated, and a combination thereof.

In the present exemplary embodiment, the transferring layer 6 consists principally of the metallic material for the purpose of preparation of an electrically conductive film pattern on the workpiece 1. However, the transferring layer 6 may be made of, for example, resin material (organic material), and a predetermined resin pattern may be formed on the workpiece 1. Such a resin pattern may be used for, for example, a resist material or a bank that defines a predetermined region. A method to prepare the transferring layer 6 that consists of the resin material on the light-heat converting layer 4 (substrate 5) may be a typical film coating method, such as extrusion coating, spin coating, gravure coating, reverse roll coating, rod coating, or micro gravure coating. In the exemplary method for coating the transferring layer 6, it is preferred to eliminate static electricity on the light-heat converting layer 4 (substrate 5) and thus uniformly apply functional fluid to prepare the transferring layer to the light-heat converting layer 4 (substrate 5). Hence, an apparatus used in each exemplary method is preferably equipped with a static eliminator.

When the transferring layer 6 is composed principally of the resin material, the surface treatment of the workpiece 1 should be designed properly. In the exemplary embodiment in which the transferring layer 6 of the metallic material is used, the surface of the workpiece 1 is treated to have mercapto groups thereon. On the other hand, when the resin material is used for the transferring layer 6, the surface treatment depends on a functional group of the resin material. Such a surface treatment is determined on the basis of the chemical interaction of the functional group on the resin material. Examples of the chemical interaction include a hydrogen bond, electrostatic interaction, acid-base interaction, hydrophobic interaction, intermolecular force, a covalent bond, an ionic bond, and a metal-thiol bond. Preferably, an organic thin-film, such as a monomolecular film or a polymer film, that has a functional group capable of these interactions is disposed on the workpiece 1.

Specifically, when the transferring layer 6 is composed of the resin material, the surface of the workpiece is preferably treated to be coated with an organic thin-film having a reactive group, such as an epoxy group or an isocyanate group on the outermost surface, or with an organic thin-film having an polar group, such as a thiol group, a hydroxyl group, a carboxyl group, or an amino group, or an ionic group, such as an ammonium group or a pyridinium group on the outermost surface.

The affinity for the workpiece 1 should be taken into account in the surface treatment described above. After the workpiece 1 is treated with the atmospheric pressure plasma, as described above, it is preferably coated with, for example, a monomolecular film having a hydrophilic group: preferably any of a carboxyl group; an amino group; a hydroxyl group; a thiol group; an isocyanate group; or a silicon group having an alkoxy group, halogen, an alkyl group, or an amino group. The monomolecular film having such a functional group also exhibits high affinity for the workpiece 1 that is composed of glass or the like. To make the workpiece 1 lyophilic, in addition to the atmospheric pressure plasma treatment in the present exemplary embodiment, ultraviolet treatment, acid treatment, or alkali treatment may be applied to the workpiece 1.

An example that utilizes the method for forming a film according to exemplary embodiments of the present invention will be described below. Firstly, a polyimide film serving as the workpiece 1 was treated with atmospheric pressure plasma at 1 mm/s. The polyimide film and a vessel that contains 3-mercaptopropyltriethoxysilane were placed in a Teflon® container. Then, the container was depressurized, was heated to 80° C., and was held at this temperature for 4 hours.

On the other hand, as the donor sheet 7, a thermosetting epoxy resin that contains carbon black was applied in a thickness of about 2 µM to a polycarbonate film having a thickness of about 0.2 mm (substrate 5) and was cured (light-heat converting layer 4). A silver ink was spin-coated on the donor sheet 7 as the transferring layer 6.

The workpiece 1 was treated with 3-mercaptopropyltriethoxysilane and was placed around a predetermined rotating drum with the treated surface facing outward. Then, the donor sheet 7 was placed around and was brought into close contact with the workpiece 1 with the light-heat converting layer 4 inside. Then, the drum was rotated at a rotational speed of 50 rpm and was irradiated once in a pattern with an 830 nm near-infrared semiconductor laser at 14 W. The silver ink was thereby transferred to the polyimide film in the laser irradiation pattern. No peeling was observed in a tape peel test for the transferred silver ink pattern. This result shows strong adhesion due to the metal-thiol bond.

An Exemplary Method to Form a Wiring Pattern

An exemplary embodiment of the method to form a wiring pattern according to exemplary embodiments of the present invention will be described below. While the film pattern of the metallic material prepared according to the method to form a film in the exemplary embodiment described above may be directly used as a wiring pattern, a method to form a wiring pattern that utilizes another exemplary aspect of the method to form a film according to the present invention will be described in this exemplary embodiment.

Figure 8:
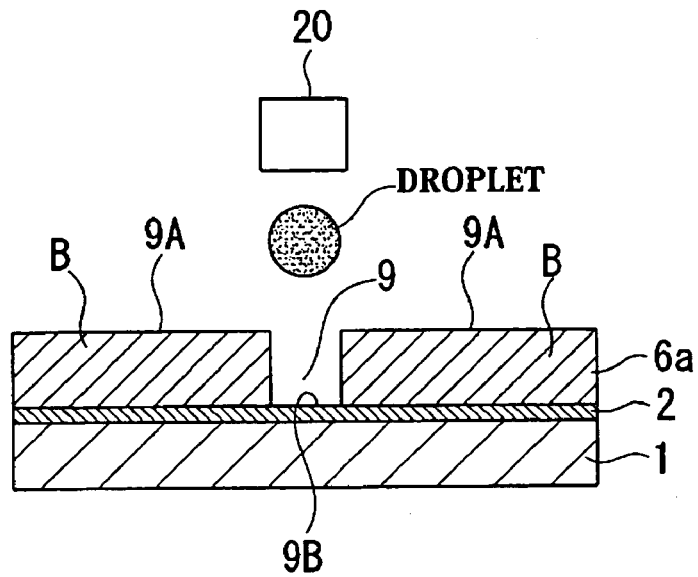
FIG. 8 is a schematic showing one example of a step of the method to form a wiring pattern according to exemplary embodiments of the present invention.

FIG. 8 shows banks B (constituted by a transferring layer 6a) and a groove 9 on the workpiece 1 after the transferring layer 6a of the resin material is transferred to the workpiece 1 by the method to form a film according to exemplary embodiments of the present invention. In the present exemplary embodiment, the banks B prepared by the transferring are then used to form a wiring pattern on the workpiece 1. The workpiece 1 has the surface treatment film 2 thereon, and the phrase "on the workpiece 1" in this exemplary embodiment refers to "on the workpiece 1 including the surface treatment film 2."

Specifically, a droplet-discharging method (ink-jet method), which discharges a droplet of functional fluid containing a material to form the wiring pattern is used to dispose the material to form the wiring pattern between each bank B on the workpiece 1. The banks B are prepared to define a predetermined wiring pattern region on the workpiece 1. In the droplet-discharging method, a droplet of functional fluid containing the material to form the wiring pattern is discharged from a discharge head 20 into the groove 9 between each bank B, while the discharge head 20 and the workpiece 1 are facing each other.

Exemplary examples of a discharge technique of the droplet-discharging method include a charge control system, a pressure vibration system, an electrothermal system, an electrostatic suction system, and an electromechanical system. The charge control system charges a material with a charging electrode, adjusts the discharge direction of the material with a deflection electrode, and discharges the material from a discharge nozzle. The pressure vibration system applies an ultrahigh pressure of about 30 kg/cm$^2$ to a material and discharges the material to the nozzle; in the absence of control voltage, the material goes straight ahead to be discharged from the discharge nozzle, whereas in the presence of control voltage electrostatic repulsion occurs between the materials and thereby scatters the material, preventing the material from being discharged. The electrothermal system rapidly vaporizes a material into bubbles by a heater disposed in a storage space of the material, and discharges the material in the space by the pressure of the bubbles. The electrostatic suction system applies a small pressure to a storage space of a material, generates a meniscus of the material in a discharge nozzle, creates electrostatic attraction in this state, and then brings out the material. The electromechanical system utilizes a property of a piezo element (piezoelectric element) by which the piezo element changes the shape on receiving a pulsed electrical signal; the deformation of the piezo element pressurizes a storage space of a material via a flexible substance, extruding the material from the space, and discharging the material from a discharge nozzle. In addition to these systems, techniques including a system that utilizes a viscosity variation of a fluid caused by electric field and a system utilizing an electric discharge spark are also available. The droplet-discharging method has an advantage in that it wastes less material and can precisely place a desired amount of the material at a desired position. The amount of droplet of a liquid material discharged by the droplet-discharging method is, for example, 1 to 300 ng. The present exemplary embodiment utilizes the electromechanical system (piezo system).

Figure 9:
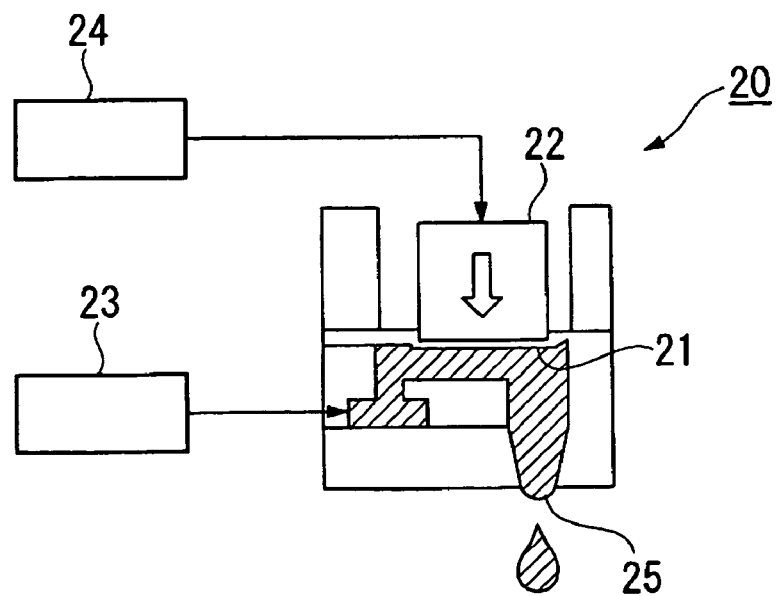
FIG. 9 is a schematic showing a discharging head for use in the method to form a wiring pattern according to exemplary embodiments of the present invention.

FIG. 9 illustrates the principle of discharging a functional fluid (liquid material) by the piezo system. In FIG. 9, a discharge head 20 includes a liquid chamber 21 that contains the functional fluid (liquid material containing a material to form the wiring pattern), and a piezo element 22 adjacent to the liquid chamber 21. The liquid chamber 21 is supplied with the functional fluid through a supply system 23 that includes a material tank containing the functional fluid. The piezo element 22 is coupled to a drive circuit 24. A voltage is applied to the piezo element 22 via the drive circuit 24 to deform the piezo element 22. This causes the deformation of the liquid chamber 21, and thereby the functional fluid is discharged from a discharge nozzle 25. The deformation level of the piezo element 22 is controlled by the applied voltage level. In addition, the deformation speed of the piezo element 22 is controlled by the frequency of the applied voltage. Discharging a droplet with the piezo system has an advantage in that it does not heat the material and therefore exerts little influence on the material composition.

The following is an exemplary procedure for providing the wiring pattern. After preparing the banks B by the method described above, firstly, residues on the bottom 9B (exposed portion of the workpiece 1) of the groove 9 between banks B are preferably subjected to an elimination process of the residues. In the elimination process, the groove 9 on the bottom 9B is exposed to, for example, ultraviolet (UV). Through the photoexcitation, the residues, in particular organic residues, on the bottom 9B can sufficiently be removed. The elimination process may be performed by, for example, $O_2$ plasma treatment, which uses oxygen ($O_2$) as a treatment gas to remove the residues. The ultraviolet irradiation and the $O_2$ plasma treatment also play a role of making the bottom 9B (exposed portion of the workpiece 1) lyophilic. This allows a droplet of the functional fluid to wet the bottom 9B sufficiently, when the droplet is placed in the groove 9, as described below.

Then, a repellent treatment is performed on the banks B, imparting repellency to their surfaces. An example of the repellent treatment is a plasma treatment ($CF_4$ plasma treatment), which uses tetrafluoromethane as a treatment gas in the atmosphere. In addition to tetrafluoromethane, other fluorocarbons may be used as the treatment gas. Furthermore, in addition to fluorochemical, any treatment gas that can impart repellency to the functional fluid may be used. Examples of the repellent treatment include a treatment with FAS (fluoroalkylsilane) (self-assembled monolayer, chemical vapor deposition and the like), conjugate plating, a method using gold-thiol, and other various known methods. Even if a portion of the droplet from the discharge head 20 is placed on the surface 9A of the bank B, the portion is repelled from the bank B owing to the repellency imparted to the banks B, falling into the groove 9 between the banks B. Consequently, the discharged functional fluid is satisfactorily placed between the banks B on the workpiece 1.

The repellent treatment to the banks B slightly affects the bottom 9B (exposed portion of the workpiece 1), which is previously made lyophilic, between the banks. However, in the workpiece 1 particularly made of glass, since no fluoro group is introduced by the repellent treatment, the lyophilic surface of the workpiece 1 is substantially unaffected. On the other hand, introduction of a preparation that exhibits the repellency into the banks B in advance will possibly eliminate the repellent treatment process.

Then, a material placement step is performed, wherein a droplet of functional fluid containing the material to form the wiring pattern is placed between banks B on the workpiece 1 with the discharge head 20. In this exemplary embodiment, an organic silver compound is used as the electrically conductive material constituting the material to form the wiring pattern, and diethylene glycol diethyl ether is used as a solvent (dispersion medium). A functional fluid containing the organic silver compound is discharged. In the material placement step, as shown in FIG. 8, a droplet of the functional fluid containing the material to form the wiring pattern is discharged from the discharge head 20. The discharged droplet is placed in the groove 9 between banks B on the workpiece 1. At that time, a wiring pattern-forming area to which the droplet is discharged is defined by banks B, preventing the droplet from spreading out into an area other than the predetermined area. In addition, even if a portion of the discharged droplet is placed on the bank B, it will fall into the groove 9 between the banks because of the repellency imparted to the banks B. Furthermore, since the bottom 9B where the workpiece 1 is exposed in the groove 9 is made lyophilic, the discharged droplet sufficiently spreads over the bottom 9B. Thus, the functional fluid is uniformly placed in the predetermined area.

The functional fluid may be a dispersion of electrically conductive fine particles in a dispersion medium. Examples of the electrically conductive fine particles are metallic fine particles that contain at least one selected from the group consisting of gold, silver, copper, aluminum, palladium, and nickel; their oxides; and fine particles of electrically conductive polymers or superconductors. The dispersion medium is not limited as long as it can disperse the electrically conductive fine particles and does not coagulate. For example, in addition to water, alcohol, such as methanol, ethanol, propanol, or butanol; a hydrocarbon compound, such as n-heptane, n-octane, decane, dodecane, tetradecane, toluene, xylene, cymene, durene, indene, dipentene, tetrahydronaphthalene, decahydronaphthalene, or cyclohexylbenzene; an ether compound, such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, or p-dioxane; a polar compound, such as propylene carbonate, γ-butyrolactone, N-methyl-2-pyrrolidone, dimethylformamide, dimethylsulfoxide, or cyclohexanone may be used. Among these, in view of the dispersibility of the fine particles, the stability of the dispersion, and the applicability to the droplet-discharging method, water, alcohol, the hydrocarbon compound, and the ether compound are preferred. Water and the hydrocarbon compound are more preferable dispersion media.

Following the material placement step (droplet discharging step), a firing step is performed. The functional fluid that contains the electrically conductive material is fired to exhibit electrical conductivity. In particular, the organic silver compound is fired to remove organic components, and thus the resulting silver particles exhibit electrical conductivity. Thus, the workpiece 1 is fired by at least one of heat treatment and light treatment after the material placement step. The heat treatment and the light treatment are typically performed in the atmosphere and may be performed in the atmosphere of inert gas, such as nitrogen, argon, or helium, if necessary. The temperature of the heat treatment or the light treatment is determined as appropriate by consideration of the boiling point (vapor pressure) of the solvent, the type and the pressure of the atmospheric gas, the dispersibility of the fine particles, the thermal behavior of the organic silver compound, its oxide or the like, the presence or the amount of a coating material, and the heat-resistant temperature of the substrate. For example, firing at about 200° C. is required to remove organic components from the organic silver compound. For a plastic substrate, the temperature is preferably from room temperature to 100° C. By these steps, the electrically conductive material (organic silver compound) is converted into a wiring pattern having electrical conductivity due to the remaining silver particles after the discharging step.

Furthermore, after the material placement step, an intermediate drying step (or the firing step) may be performed. Alternately repeating the material placement step and the intermediate drying step (firing step) more than once generates a laminate of the material to form the wiring pattern between the banks B. After the firing step, the banks B on the workpiece 1 may be removed. For example, the bank B may be removed from the workpiece 1 by washing with a certain solvent.

Plasma Display

Figure 10:
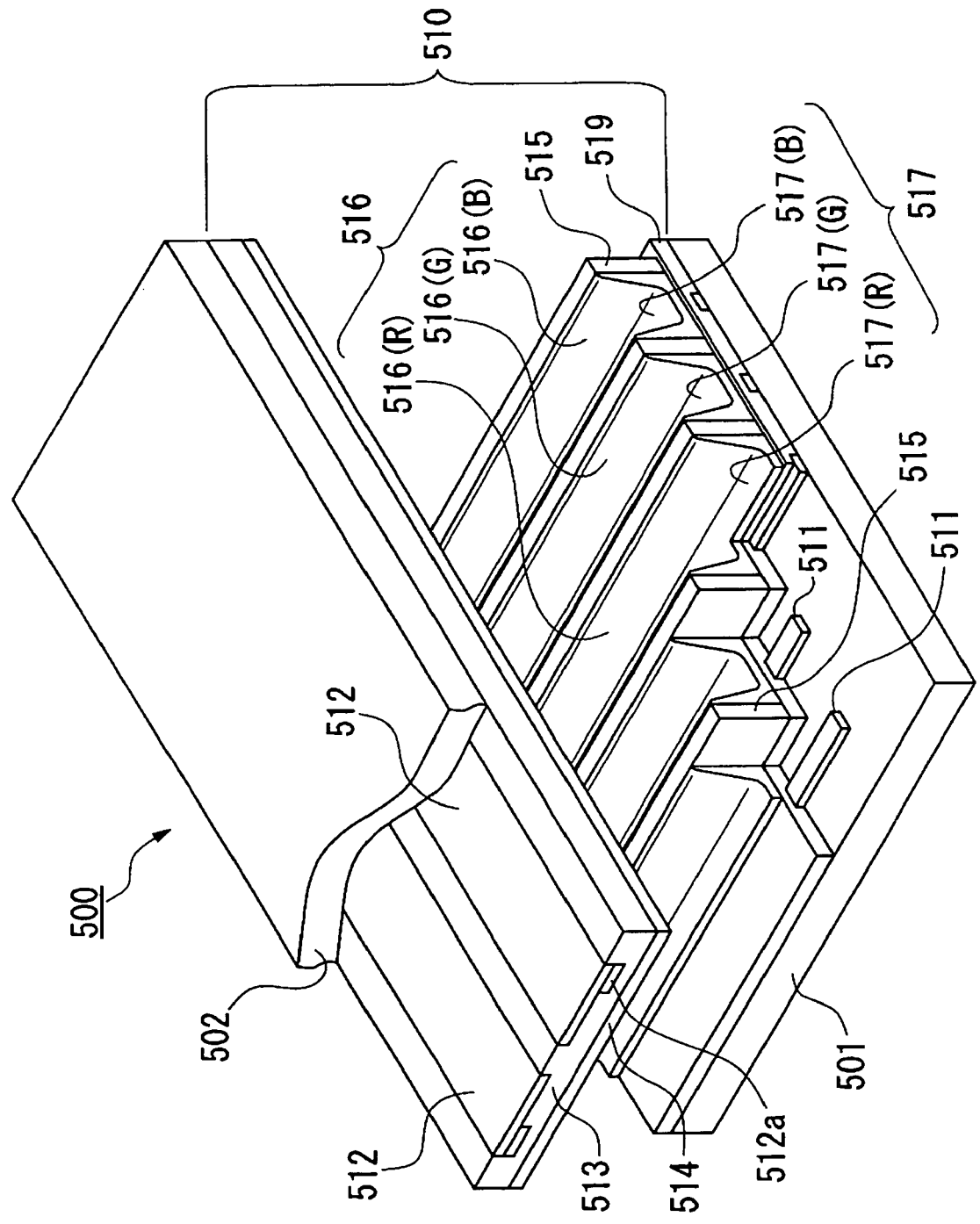
FIG. 10 is a schematic exploded perspective view of a plasma display as one example of an electro-optical device having a wiring pattern formed by the method to form a wiring pattern according to exemplary embodiments of the present invention.

A plasma display will now be described with reference to FIG. 10 as an example of the electro-optical device having the wiring pattern that is formed by the method for forming a wiring pattern according to exemplary embodiments of the present invention. FIG. 10 is a schematic exploded perspective view of a plasma display 500 that includes address electrodes 511 and bus electrodes 512a. The plasma display 500 includes a glass substrate 501, a glass substrate 502, and intermediate discharge displays 510, both substrate facing each other.

The discharge display 510 has a plurality of discharge chambers 516. Among the plurality of discharge chambers 516, three discharge chambers 516, that is, a red discharge chamber 516(R), a green discharge chamber 516(G), and a blue discharge chamber 516(B) are disposed to compose one pixel. The address electrodes 511 are spaced on the (glass) substrate 501 at a predetermined interval in a stripe. A dielectric layer 519 is disposed to cover the address electrodes 511 and the substrate 501. Partition walls 515 are disposed on the dielectric layer 519 between the address electrodes 511 along each address electrode 511. In addition to the partition walls 515, there are other partition walls that are disposed in the longitudinal direction, which is orthogonal to the address electrodes 511, at predetermined positions and are spaced at a predetermined interval (not shown). The partition walls that are in contact with both longitudinal sides of the address electrodes 511 and the partition walls that extends orthogonal to the address electrodes 511 basically define rectangle areas, which correspond to the discharge chambers 516 and three of which compose one pixel. Fluorescent substances 517 are disposed within the rectangle areas that are defined by the partition walls 515. Fluorescent substances 517 emit fluorescence of red, green, or blue; red fluorescent substances 517(R) are disposed on the bottom of the red discharge chambers 516(R), green fluorescent substances 517(G) are disposed on the bottom of the green discharge chambers 516(G), and blue fluorescent substances 517(B) are disposed on the bottom of the blue discharge chamber 516(B).

For the glass substrate 502, stripe-shaped transparent display electrodes 512, which are composed of a plurality of ITO, are disposed orthogonal to the address electrodes 511 at a predetermined interval, and bus electrodes 512a, which are composed of metal, are also disposed to make up for the high-resistance of the ITO. These electrodes are covered with a dielectric layer 513. The dielectric layer 513 is covered with a protective film 514, which contains MgO. In the substrate 5, the substrate 501 and the glass substrate 502 are laminated such that the address electrodes 511 and the display electrodes 512 orthogonally face each other. The discharge chambers 516 are formed by evacuating a space surrounded with the substrate 501, the partition walls 515, and the protective film 514 over the glass substrate 502, and by enclosing rare gas in the space. Two display electrodes 512 are placed on the glass substrate 502 for each discharge chamber 516. The address electrodes 511 and the display electrodes 512 are coupled to an alternating-current power supply (not shown). Passing electric current through each electrode excites the fluorescent substance 517 at a desired position in the discharge display 510, causing the fluorescent substance 517 to emit light and display a color.

In this example, the address electrodes 511 and bus electrodes 512a are particularly formed by the method to form a wiring pattern according to exemplary embodiments of the present invention. Specifically, the address electrodes 511 and the bus electrodes 512a are formed by discharging a functional fluid that contains dispersed colloidal metal (for example, colloidal gold or colloidal silver) or dispersed electrically conductive fine particles (for example, metal fine particles) and that has an advantage in patterning, followed by drying and firing. Fluorescent substances 517 may also be formed by discharging a functional fluid that contains a fluorescent material in a solvent or a dispersed fluorescent material in a dispersion medium from the discharge head 20, followed by drying and firing.

Thin Film Transistor

Figure 11A:
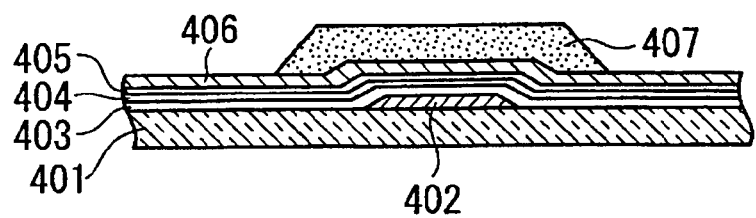
FIGS. 11(a)–(f) are schematics showing an example of a step of a method to manufacture a semiconductor device according to exemplary embodiments of the present invention. The schematic shows one example of a step to manufacture a thin film transistor.
Figure 11B:
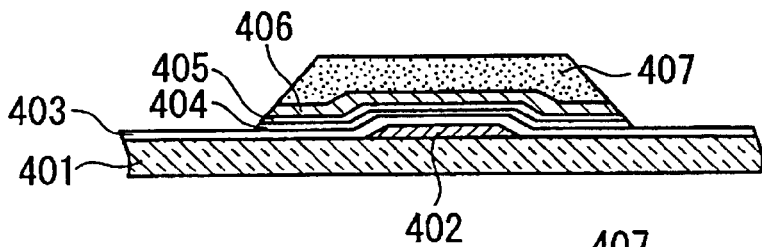
Figure 11C:
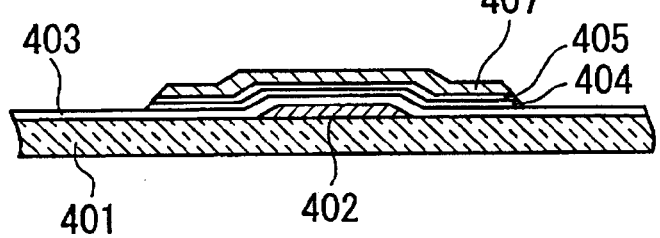
Figure 11D:
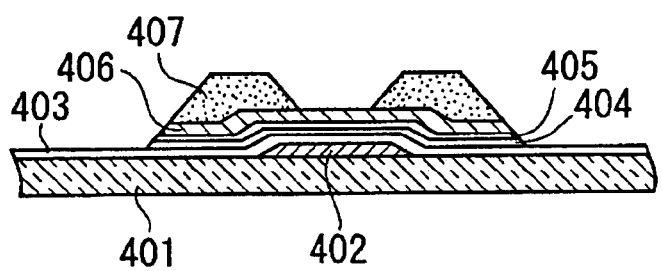
Figure 11E:
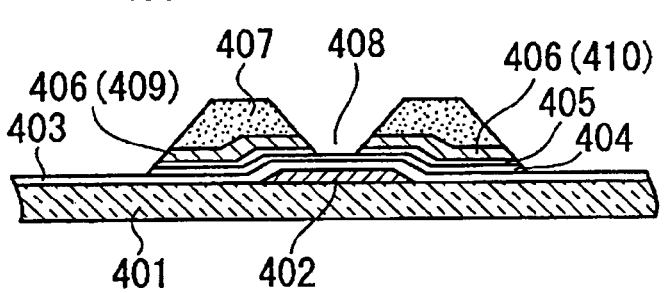
Figure 11F:
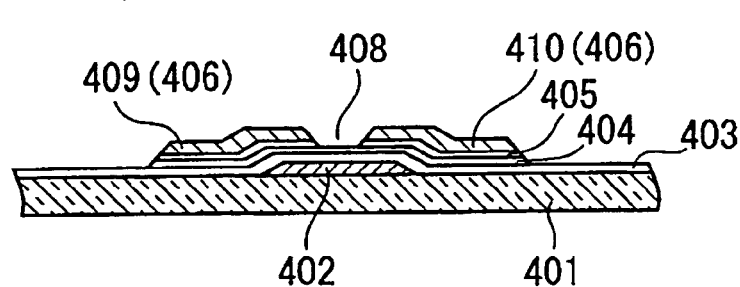

A procedure to prepare a thin film transistor will now be described as an example of the method for manufacturing a semiconductor device according to exemplary embodiments of the present invention, with reference to FIG. 11. As shown in FIG. 11(a), a gate insulating layer 403, an a-Si layer 404, which is an active semiconductor layer composed of undoped amorphous silicon, a N$^+$a-Si layer 405, which is composed of silicon doped with a concentrated phosphorus and the like, and a metal layer 406 for source/drain electrodes are sequentially laminated on a substrate 401, which includes a gate electrode 402. A transferring layer 407 is patterned on a part of the metal layer 406 for source/drain electrodes by the method to form a film according to exemplary embodiments of the present invention. Then, as shown in FIG. 11(b), a-Si layer 404, N+a-Si layer 405, and the metal layer 406 for source/drain electrodes are etched. As shown in FIG. 11(c), the transferring layer 407 is subjected to ashing. Then, as shown in FIG. 11(d), another transferring layer 407 is formed by the method to form a film according to exemplary embodiments of the present invention. As shown in FIG. 11(e), a part of the N+a-Si layer 405 and a part of the metal layer 406 for source/drain electrodes, both parts corresponding to a channel 408 of the thin film transistor, are etched. As shown in FIG. 11(f), the transferring layer 407 is subjected to ashing and thereby the channel 408, a source electrode 409, and a drain electrode 410 are formed. Finally, a pixel electrode (not shown) that is coupled to the drain electrode 410 is formed. Consequently, a thin film transistor (TFT) is manufactured.

Organic EL Display

Figure 12:
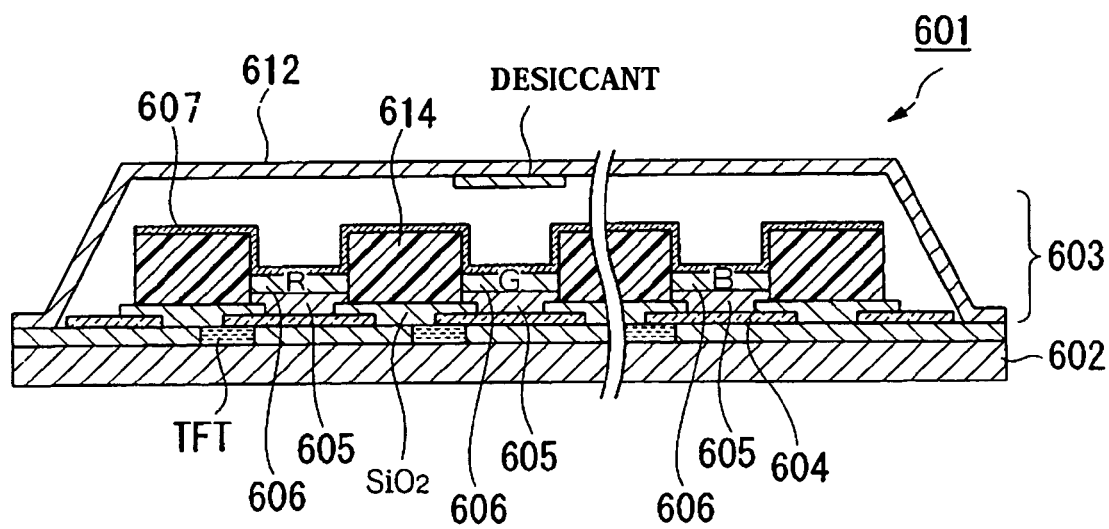
FIG. 12 is a schematic sectional view of an organic EL display as an example of an electro-optical device having a semiconductor device that is manufactured by the method to manufacture a semiconductor device according to exemplary embodiments of the present invention.

An organic electroluminescent (EL) display will now be described as an example of the electro-optical device that includes the thin film transistor (semiconductor device), with reference to FIG. 12. In FIG. 12, an organic EL display 601 includes a substrate (optically transparent layer) 602, which is transparent to light; organic EL elements (light-emitting elements) 603, which are disposed on one side of a substrate 602 and include an electroluminescent layer (EL layer) 606 composed of an organic electroluminescent material supported by a pair of electrodes (a positive electrode 604 and a negative electrode 607) and a hole injection/transport layer 605; thin film transistors TFT, which are disposed on one side of the substrate 602 and are coupled to the positive electrodes (pixel electrodes) 604; and a sealing substrate 612. The electroluminescent layer 606 includes three electroluminescent layers of red (R), green (G), and blue (B). The sealing substrate 612 and the substrate 602 are bonded with an adhesive layer, and the organic EL elements 603 are sealed with the sealing substrate 612 and the adhesive layer. The organic EL display 601 in FIG. 12 is of a bottom emission type or a substrate emission type, which leads the emission from the electroluminescent layer 606 from the substrate 602 to the outside of the display.

Examples of a material that forms the substrate 602 include optically transparent and translucent materials, such as a transparent glass, quartz, sapphire, and transparent synthetic resins, such as polyester, polyacrylate, polycarbonate, and polyetherketone. In particular, a suitable material that forms the substrate 602 is an inexpensive glass.

The sealing substrate 612 is, for example, a glass substrate, though a transparent gas barrier component other than a glass substrate, for example, a plastic, a plastic laminate film, or a laminated substrate, or a glass laminate film may be used. In addition, an ultraviolet-absorbing component is preferably used as a protective layer.

The positive electrode (pixel electrode) 604 is a transparent electrode of indium tin oxide (ITO), which is transparent to light. Examples of the hole injection/transport layer 605 include polymer materials, such as polythiophene, polystyrene sulfonate, polypyrrole, polyaniline, and their derivatives. A material to form the electroluminescent layer 606 may be a light-emitting polymer or a low molecular organic light-emitting dye, that is, a light-emitting substance, such as a fluorescent substance or phosphor. Among conjugated polymers, which are potential light-emitting substances, those having an arylene vinylene structure or a polyfluorene structure are preferable. An electron transport layer or an electron injection layer may be provided between the negative electrode 607 and the electroluminescent layer 606, if necessary.

The organic EL element 603 is disposed in an area partitioned by banks 614. The organic EL element 603 is formed using the discharge head 20.

Although not shown in the drawings, the organic EL display 601 of the present exemplary embodiment is of an active matrix type, and in practice a plurality of data lines and a plurality of scanning lines are placed in a grid pattern on the substrate 602. The organic EL elements 603 for each pixel, which is arranged in a matrix defined by the data lines or the scanning lines, are coupled to each other via a driving TFT, such as a switching transistor or a driving transistor. A driving signal via the data lines or the scanning lines generates current through the electrodes and causes the electroluminescent layer 606 of the organic EL element 603 to emit light outside of the substrate 602 and light the pixel.

While an example of applying the thin film transistor to the organic EL displayed is described above, it is needless to say that the thin film transistor according to exemplary embodiments of the present invention can be applied to other displays, such as a liquid crystal display, that have switching elements.

Electronic Device

Figure 13:
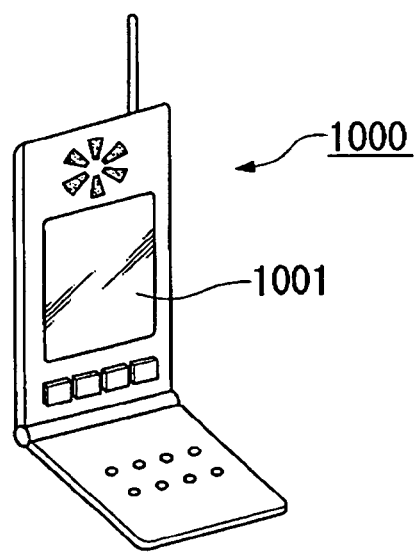
FIG. 13 is a schematic showing an example of an electronic device of exemplary embodiments of the present invention.

An application of an electronic device that includes the electro-optical device (organic EL display, plasma display or the like) will be described below. FIG. 13 is a perspective view of an example of a mobile phone. In FIG. 13, reference numeral 1000 represents the main body of the mobile phone, and reference numeral 1001 represents a display that includes the electro-optical device. The electronic device shown in FIG. 13, which includes the electro-optical device of the exemplary embodiments described above, has an excellent display quality, thus addressing or achieving an electronic device having a highly reliable display.

In addition to this example, other electronic devices include liquid crystal television, video tape recorders with viewfinders, direct-view video tape recorders, car navigation systems, pagers, electronic organizers, electronic calculators, word processors, workstations, videophones, POS terminals, electronic paper, and devices equipped with touch panels. The electro-optical device according to exemplary embodiments of the present invention may be used for displays of such electronic devices.

What is claimed is:

1. A method to form a predetermined film on the workpiece, comprising:
    forming a transferring layer on a substrate;
    treating a surface of the workpiece to enhance adhesion between the transferring layer and the workpiece by chemical interaction; and
    transferring at least a portion of the transferring layer from the substrate to the treated surface of the workpiece to form the predetermined film on the workpiece;
    introducing a light-heat converting material, which converts light energy into thermal energy, into the substrate;
    mixing the light-heat converting material into the substrate; and
    irradiating a predetermined area on the substrate while the transferring layer and the workpiece face each other to transfer the transferring layer selectively to the irradiated area on the workpiece.

2. The method to form a film according to claim 1, further comprising: basing the chemical interaction on at least one of a hydrogen bond, electrostatic interaction, acid-base interaction, hydrophobic interaction, intermolecular force, a covalent bond, an ionic bond, and a metal-thiol bond.

3. The method to form a film according to claim 1, further comprising: forming an organic thin-film on the workpiece as the surface treatment.

4. The method to form a film according to the claim 3, the organic thin-film including a monomolecular film or a polymer film.

5. The method to form a film according to claim 3, the organic thin-film including a carboxyl group; an amino group; a hydroxyl group; a thiol group; an isocyanate group; or a silicon group having an alkoxy group, halogen, an alkyl group, or an amino group.

6. The method to form a film according to claim 3, further comprising:
making the surface of the workpiece lyophilic before the formation of the organic thin-film.

7. The method to form a film according to claim 6, making the surface of the workpiece lyophilic being achieved by ultraviolet treatment, oxygen plasma treatment, acid treatment, or alkali treatment.

8. The method to form a film according to claim 1, the transferring layer being made of an organic material, and the surface of the workpiece being treated to have enhanced adhesion by chemical interaction with the organic material.

9. The method to form a film according to claim 8, further comprising:
treating the surface of the workpiece by outwardly disposing at least one of (1) a reactive group, comprising at least one of an epoxy group or an isocyanate group; (2) a polar group, comprising at least one of a thiol group, a hydroxyl group, a carboxyl group, or an amino group; or (3) an ionic group, comprising at least one of an ammonium group or a pyridinium group, on the workpiece.

10. The method for forming a film according to claim 1, the transferring layer being made of a metallic material, and the surface of the workpiece being treated to have enhanced adhesion by chemical interaction with the metallic material.

11. The method to form a film according to claim 10, further comprising:
treating the surface of the workpiece by outwardly disposing a metal-coordinating group, comprising at least one of a thiol group or an amino group, on the workpiece.

12. The method to form a film according to claim 1, further comprising: providing the transferring layer and a light-heat converting layer containing the light-heat converting material, both layers being independent of the substrate.

13. The method to form a film according to claim 12, further comprising:
disposing the light-heat converting layer between the substrate and the transferring layer.

14. The method to form a film according to claim 12, further comprising:
disposing the light-heat converting layer on another surface of the substrate, which does not face the transferring layer.

15. The method to form a film according to claim 1, further comprising: mixing the light-heat converting material into the transferring layer.

16. The method to form a film according to claim 1, further comprising:
providing a gas-generating layer containing a gas-generating material, which generates gas by light irradiation or heating, between the substrate and the transferring layer.

17. The method to form a film according to claim 1, further comprising:
performing the light irradiation to the substrate through a mask having a predetermined pattern.

18. The method to form a film according to claim 1, further comprising:
performing the light irradiation while the substrate and the workpiece move relative to the light.

19. The method to form a film according to claim 1, further comprising:
performing the light irradiation while the transferring layer on the substrate is in contact with the workpiece.

20. The method to form a film according to claim 19, further comprising:
placing the transferring layer on the substrate opposite the workpiece; and
depressurizing a space between the transferring layer and the workpiece to bring the transferring layer and the workpiece into contact with each other.

21. The method to form a film according to claim 20, further comprising:
separating the substrate and the workpiece by relieving a vacuum between the substrate and the workpiece after transferring.

22. A method to form a wiring pattern, comprising:
using the transferring layer, which is formed on a workpiece by the method to form a film according to claim 1, to form the wiring pattern.

23. A method to form a wiring pattern, comprising:
forming banks by using the transferring layer, which is formed on a workpiece by the method to form a film according to claim 1; and
placing a droplet containing a material to form the wiring pattern between the banks to form the wiring pattern on the workpiece.

24. A method to manufacture a semiconductor device, comprising:
forming a wiring pattern by the method according to claim 22; and
manufacturing a semiconductor element by utilizing the wiring pattern.

25. A method to form a predetermined film on the workpiece, comprising:
forming a transferring layer on a substrate;
treating a surface of the workpiece to enhance adhesion between the transferring layer and the workpiece by chemical interaction; and
transferring at least a portion of the transferring layer from the substrate to the treated surface of the workpiece to form the predetermined film on the workpiece;
introducing a light-heat converting material, which converts light energy into thermal energy, into the substrate;
irradiating a predetermined area on the substrate while the transferring layer and the workpiece face each other to transfer the transferring layer selectively to the irradiated area on the workpiece; and
mixing a gas-generating material, which generates a gas by light irradiation or heating, into the substrate.

26. The method to form a film according to claim 25, further comprising: basing the chemical interaction on at least one of a hydrogen bond, electrostatic interaction, acid-base interaction, hydrophobic interaction, intermolecular force, a covalent bond, an ionic bond, and a metal-thiol bond.

27. The method to form a film according to claim 25, further comprising: forming an organic thin-film on the workpiece as the surface treatment.

28. The method to form a film according to the claim 27, the organic thin-film including a monomolecular film or a polymer film.

29. The method to form a film according to claim 27, the organic thin-film including a carboxyl group; an amino group; a hydroxyl group; a thiol group; an isocyanate group; or a silicon group having an alkoxy group, halogen, an alkyl group, or an amino group.

30. The method to form a film according to claim 27, further comprising:
    making the surface of the workpiece lyophilic before the formation of the organic thin-film.

31. The method to form a film according to claim 30, making the surface of the workpiece lyophilic being achieved by ultraviolet treatment, oxygen plasma treatment, acid treatment, or alkali treatment.

32. The method to form a film according to claim 25, the transferring layer being made of an organic material, and the surface of the workpiece being treated to have enhanced adhesion by chemical interaction with the organic material.

33. The method to form a film according to claim 32, further comprising:
    treating the surface of the workpiece by outwardly disposing at least one of (1) a reactive group, comprising at least one of an epoxy group or an isocyanate group; (2) a polar group, comprising at least one of a thiol group, a hydroxyl group, a carboxyl group, or an amino group; or (3) an ionic group, comprising at least one of an ammonium group or a pyridinium group, on the workpiece.

34. The method for forming a film according to claim 25, the transferring layer being made of a metallic material, and the surface of the workpiece being treated to have enhanced adhesion by chemical interaction with the metallic material.

35. The method to form a film according to claim 34, further comprising:
    treating the surface of the workpiece by outwardly disposing a metal-coordinating group, comprising at least one of a thiol group or an amino group, on the workpiece.

36. The method to form a film according to claim 25, further comprising: providing the transferring layer and a light-heat converting layer containing the light-heat converting material, both layers being independent of the substrate.

37. The method to form a film according to claim 36, further comprising:
    disposing the light-heat converting layer between the substrate and the transferring layer.

38. The method to form a film according to claim 36, further comprising:
    disposing the light-heat converting layer on another surface of the substrate, which does not face the transferring layer.

39. The method to form a film according to claim 25, further comprising: mixing the light-heat converting material into the transferring layer.

40. The method to form a film according to claim 25, further comprising:
    providing a gas-generating layer containing a gas-generating material, which generates gas by light irradiation or heating, between the substrate and the transferring layer.

41. The method to form a film according to claim 25, further comprising:
    performing the light irradiation to the substrate through a mask having a predetermined pattern.

42. The method to form a film according to claim 25, further comprising:
    performing the light irradiation while the substrate and the workpiece move relative to the light.

43. The method to form a film according to claim 25, further comprising:
    performing the light irradiation while the transferring layer on the substrate is in contact with the workpiece.

44. The method to form a film according to claim 43, further comprising:
    placing the transferring layer on the substrate opposite the workpiece; and
    depressurizing a space between the transferring layer and the workpiece to bring the transferring layer and the workpiece into contact with each other.

45. The method to form a film according to claim 44, further comprising:
    separating the substrate and the workpiece by relieving a vacuum between the substrate and the workpiece after transferring.

46. A method to form a wiring pattern, comprising:
    using the transferring layer, which is formed on a workpiece by the method to form a film according to claim 25, to form the wiring pattern.

47. A method to form a wiring pattern, comprising:
    forming banks by using the transferring layer, which is formed on a workpiece by the method to form a film according to claim 25; and
    placing a droplet containing a material to form the wiring pattern between the banks to form the wiring pattern on the workpiece.

48. A method to manufacture a semiconductor device, comprising:
    forming a wiring pattern by the method according to claim 46; and
    manufacturing a semiconductor element by utilizing the wiring pattern.

* * * * *